(12) United States Patent
Lee

(10) Patent No.: US 6,309,940 B1
(45) Date of Patent: Oct. 30, 2001

(54) LATCH-UP RESISTANT CMOS STRUCTURE

(75) Inventor: Joo-Hyong Lee, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/290,891

(22) Filed: Apr. 14, 1999

(30) Foreign Application Priority Data

Dec. 30, 1998 (KR) .................................. 98-62565

(51) Int. Cl.[7] .................... H01L 21/331; H01L 29/76
(52) U.S. Cl. .................. 438/370; 438/224; 438/228; 438/235; 438/373; 438/376; 438/526; 257/372; 257/373
(58) Field of Search ........................ 438/369, 370, 438/371, 372, 373, 374, 375, 376, 224, 228, 235, 526; 257/372, 373

(56) References Cited

U.S. PATENT DOCUMENTS

| 5,010,034 | * | 4/1991 | Manoliu | 438/207 |
| 5,013,671 | * | 5/1991 | Havemann | 148/DIG. 10 |
| 5,047,357 | * | 9/1991 | Eklund | 438/207 |
| 5,342,794 | * | 8/1994 | Wei | 438/374 |
| 5,407,840 | * | 4/1995 | Manoliu et al. | 438/202 |
| 5,436,176 | * | 7/1995 | Shimizu et al. | 438/526 |
| 5,677,209 | * | 10/1997 | Shon et al. | 148/DIG. 10 |
| 5,877,049 | * | 3/1999 | Liu et al. | 438/224 |
| 5,963,798 | * | 10/1999 | Kim et al. | 438/199 |
| 5,966,599 | * | 10/1999 | Walker et al. | 438/228 |
| 6,069,048 | * | 5/2000 | Daniel | 438/370 |

OTHER PUBLICATIONS

Ajith Amerasekera, et al. "Designing Latchup Robustness in a 0.35 μm Technology" IEEE/IRPS 1994, pp. 280–283.

* cited by examiner

*Primary Examiner*—Eddie Lee
*Assistant Examiner*—José R. Diaz
(74) *Attorney, Agent, or Firm*—Fleshner & Kim, LLP

(57) ABSTRACT

Provided with a semiconductor device including: a semiconductor substrate having a first conductivity type; a first well having a second conductivity type formed in a first region in a major surface of the semiconductor substrate; a second well having the first conductivity type formed in a second region in the major surface of the semiconductor substrate; a first MOS transistor having the first conductivity type and a first contact region having the second conductivity type formed in the first well; a second MOS transistor having the second conductivity type and a second contact region having the second conductivity type formed in the second well; a heavily doped region of buried layer having the second conductivity type formed at a portion corresponding to the first contact region in the first well; and a heavily doped region of buried layer having the first conductivity type formed at a portion corresponding to the second contact region in the second well.

18 Claims, 5 Drawing Sheets

LATCH-UP RESISTANT CMOS STRUCTURE

BACKGROUND OF THE INVENTION

1. Field of the Invention

The present invention relates to a semiconductor device and its fabrication method and, more particularly, to a semiconductor device which avoids latch-up by reducing the shunting resistance between the emitter and base of a parasitic bipolar transistor and the current gain of the base, and its fabrication method.

2. Discussion of Related Art

Latch-up, a generic problem associated with complementary metal oxide semiconductor (hereinafter called CMOS) structures causes undesirable conduction phenomena to occur in the parasitic NPN and PNP bipolar transistors inherent in CMOS structure, for example, malfunction or destruction of the devices due to over-current such as transient pulses.

In scaling down of CMOS integrated circuits, the closer spacing between semiconductor regions, especially, P and N junctions increases the current gain of the parasitic NPN and PNP bipolar transistors and turns on the parasitic SCR (Silicon Controlled Rectifier) structure and latch it into conductivity state. Namely, latch-up occurs.

FIG. 1 is a cross-sectional view of the related art semiconductor device.

Referring to FIG. 1, the related art semiconductor device, e.g., CMOS inverter circuit has P well 22 and N well 21 formed in a semiconductor substrate 11. A field oxide layer 13 is formed to define the active and isolation regions of the device. A heavily doped P type regions 27 and 28 are formed in the N well 21 by using a first gate 37 overlying a gate insulating layer 23 as a mask. A heavily doped N type region of N-well contact 30 is then formed at a predetermined portion in the N well 21. The heavily doped P type regions 28 and 27 become source and drain regions of P channel FET, respectively. A heavily doped N type regions 25 and 26 are formed in the P well 22 by using a second gate 38 overlying the gate insulating layer 23 as a mask. A heavily doped P type region of P-well contact region 29 is formed at a predetermined portion in the P well 22. The heavily doped N type regions 25 and 26 become source and drain regions of N channel FET, respectively.

In the CMOS inverter circuit 39 having the above-described structure, the P-well contact region 29 and the source region 25 of N channel FET are connected to a ground terminal $V_{SS}$, while the source region 28 of P channel FET and the N-well contact region 30 are connected to a power source $V_{DD}$. The first and second gates 37 and 38 are connected to an input terminal $V_{IN}$, and the drains 26 and 27 of N channel and P channel FETs being connected to an output terminal $V_{OUT}$.

In operation, a signal applied to the input terminal $V_{IN}$ at logic high voltage level will cause the N channel FET to turn on. At the same time, the P channel FET is turned off, such that substantially no current flows between the drain and source regions 27 and 28 of P channel FET.

The output terminal $V_{OUT}$ connected to the drain regions 26 and 27 is therefore pulled to the lower supply voltage $V_{SS}$ through the N channel FET. The CMOS inverter circuit 39 has thus inverted the input logic high voltage level to an output logic low voltage level.

As shown in FIG. 1, the CMOS semiconductor device 39 includes two parasitic bipolar transistors 35 and 36. The transistor 35 is an NPN bipolar transistor with source region 25 of N channel FET forming its emitter, the P well 22 forming its base and N well 21 forming its collector. The transistor 36 is a PNP bipolar transistor with source region 28 of P channel FET forming its emitter, the N well 21 forming its base and the P well 22 forming its collector.

In normal operation of the CMOS inverter circuit 39, the transistors 35 and 36 are off and the emitter-base PN junction thereof conducts only a minimal leakage current. However, a voltage drop of over 0.6 volts occurs at the ground terminal Vss momentarily due to an electrostatic discharge (ESD) voltage spike inadvertently applied to the device. This voltage drop causes electrons to be injected from the source region 25 of N channel FET into P well 22, then the NPN transistor 35 is turned on and the electrons reach the N well 21.

In a case where the electron current(I) and the resistance (R) between N-well contact region 30 and the source region 28 of P channel FET are high sufficiently, a voltage drop of about 0.6 volts also occurs in a small critical current or N-well current, turning the transistor 36 on. This drop in potential causes holes to be injected into the N well 21 from the source region 28 of P channel PET and reaches the P well 22.

Furthermore, when the resistance between P-well contact region 29 and the source region 25 of N channel FET is high sufficiently, a voltage drop of about 0.6 volts occurs in a small critical current or P-well current to turn the transistor 35 on. This voltage drop causes electrons to be injected into the P well 22 from the source region 25. This electron current adds to the initial current and strengthens the positive feed back between PNP and NPN transistors 36 and 35, respectively, which thus leads to the latch-up condition.

The related art CMOS inverter circuit 39 is, however, disadvantageous in that a voltage drop capable of turning on the bipolar transistors 36 and 35 occurs at a small critical current and the latch-up occurs in a case of the sufficiently high resistance between the N-well contact region 30 and the source region 28 of P channel FET or between the P-well contact region 29 and the source region 25 of N channel FET.

SUMMARY OF THE INVENTION

Accordingly, an objective of the present invention is to provide a semiconductor device which avoids latch-up with the presence of heavily doped region of buried layer formed at a predetermined portion in the wells.

Another objective of the present invention is to provide a method of fabricating the latch-up resistant semiconductor device.

To achieve the first object of the present invention, a semiconductor device includes: a semiconductor substrate having a first conductivity type; a first well having a second conductivity type formed in a first region in a major surface of the semiconductor substrate; a second well having the first conductivity type formed in a second region in the major surface of the semiconductor substrate; a first MOS transistor having the first conductivity type and a first contact region having the second conductivity type formed in the first well;
  a second MOS transistor having the second conductivity type and a second contact region having the second conductivity type formed in the second well; a heavily doped region of buried layer having the second conductivity type formed at a portion corresponding to the first contact region in the first well; and a heavily doped region of buried layer having the first conductivity type formed at a portion corresponding to the second contact region in the second well.

To achieve the second object of the present invention, a method of fabricating a semiconductor device includes the steps of: forming a field oxide layer on a semiconductor substrate having a first conductivity type where the semiconductor substrate is included first and second MOS transistor regions and first and second contact regions; forming a first well having a second conductivity type in the major surface of the semiconductor substrate having the first MOS transistor region and the first contact region; forming a heavily doped region of buried layer having the second conductivity type at a portion spaced corresponding to the first contact region in the first well; forming a second well having the first conductivity type in the semiconductor substrate having the second MOS transistor region and the second contact region; and forming a heavily doped region of buried layer having the first conductivity type at a portion spaced corresponding to the second contact region in the second well.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENT

Hereinafter, the present invention will be described in detail with reference to the accompanying drawings.

Figure 1:
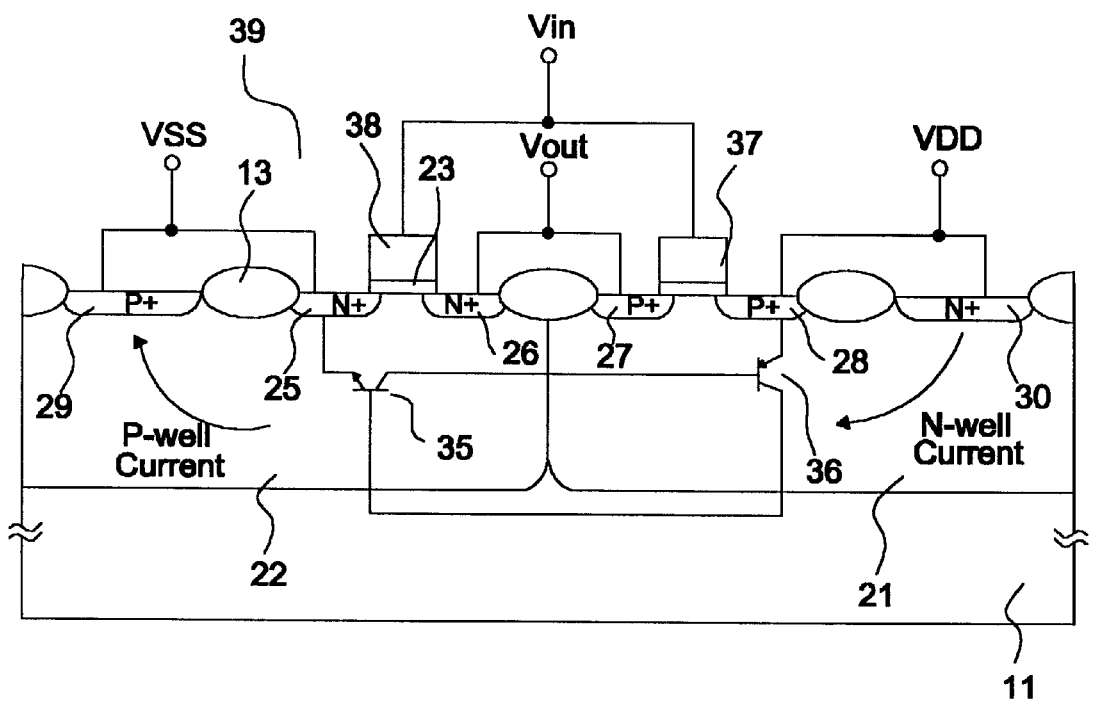
FIG. 1 is a cross-sectional view of the related art semiconductor device.
Figure 2:
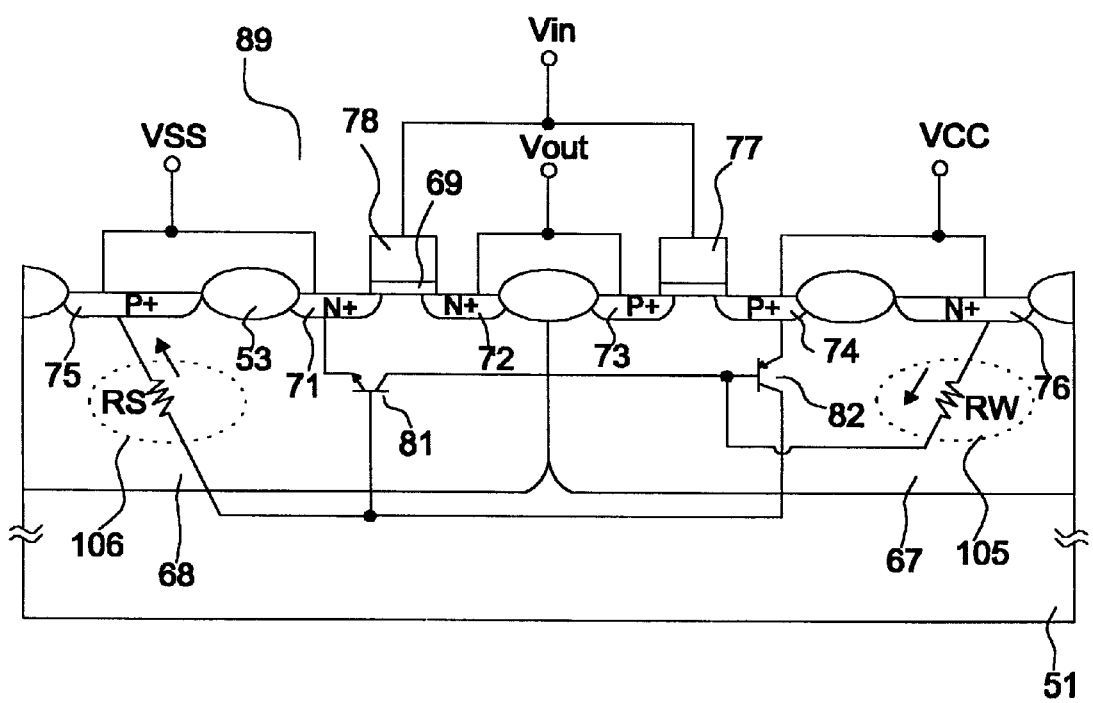
FIG. 2 is a cross-sectional view of a semiconductor device according to the present invention.

FIG. 2 is a cross-sectional view of a semiconductor device according to the present invention.

The present invention semiconductor device, e.g., CMOS inverter circuit has P well 68 and N well 67 formed in a semiconductor substrate 51.

A first heavily doped region of buried layer 105 having the same conductivity type as the N well is formed at a predetermined portion in the N well region 67 corresponding to an N-well contact region 76, while a second heavily doped region of buried layer 106 having the same conductivity type as the P well is formed at a predetermined portion in the P well region 68 corresponding to the P-well contact region 75. The first and second heavily doped region of buried layer 105 and 106 are formed in a predetermined location at a distance of about 0.25 to 1.0 $\mu$m beneath the major surface of the semiconductor substrate 51.

A heavily doped P type regions 73 and 74 are formed in the N well region 67 by using a first gate 77 overlying a gate insulating layer 69 as a mask. A heavily doped N type region of N well contact region 76 is then formed at a predetermined portion in the N well region 67. The heavily doped P type regions 74 and 73 become source and drain regions of P channel FET, respectively.

A heavily doped N type regions 71 and 72 are formed in the P well 68 by using a second gate 78 overlying the gate insulating layer 69 as a mask. A heavily doped P type region of P-well contact region 75 is then formed at a predetermined portion in the P well region 68. The heavily doped N type regions 71 and 72 become source and drain regions of N channel FET, respectively.

In the CMOS inverter circuit 89 having the above-described structure, the P-well contact region 75 and the source region 71 of N channel FET are connected to a ground terminal $V_{SS}$, while the source region 74 of P channel FET and the N-well contact region 76 are connected to a power source $V_{DD}$. The first and second gates 77 and 78 are connected to an input terminal $V_{IN}$, the drains 72 and 73 of N channel and P channel FETs being connected to an output terminal $V_{OUT}$.

In operation, a signal applied to the input terminal $V_{IN}$ at logic high voltage level will cause the N channel FET to turn on. At the same time, the P channel FET is turned off, such that substantially no current flows between the drain and source regions 73 and 74 of P channel FET.

The output terminal $V_{OUT}$ connected to the drain regions 72 and 73 is therefore pulled to the lower supply voltage $V_{SS}$ through the N channel FET. The CMOS inverter circuit 89 has thus inverted the input logic high voltage level to an output logic low voltage level.

As shown in FIG. 2, the CMOS semiconductor device 89 includes two parasitic bipolar transistors 81 and 82. The transistor 81 is an NPN bipolar transistor with source region 71 of N channel FET forming its emitter, the P well 68 forming its base and N well 67 forming its collector. The transistor 82 is a PNP bipolar transistor with source region 74 of P channel FET forming its emitter, the N well 67 forming its base and the P well 68 forming its collector. In normal operation of the CMOS inverter circuit 89, the transistors 81 and 82 are off and the emitter-base PN junction thereof conducts only a minimal leakage current.

However, applying transient pulses makes it possible to flow a considerably high leakage current in the well. As described in the description of the related art, this leakage current may cause a voltage drop of over 0.6 volts in case of a high resistance between the well contact region and the source of MOS FET. The voltage drop turns on the parasitic bipolar transistors. In the present invention, however, the shunting resistance between emitter and base of the transistor 82 is reduced by forming the first heavily doped region of buried layer 105 at a predetermined portion in the N well region 67 corresponding to the N-well contact region 76. Thus reduced shunting resistance hardly leads to a voltage drop that forces transistor 82 to be turned on, although the leakage current in the N well is considerably high. In other words, the shunting current, a critical current that causes latch-up is higher than the raised leakage current in the N well, which suppresses latch-up. Similarly, the shunting resistance between emitter and base of the transistor 81 can be reduced by forming the second heavily doped region of buried layer 106 at a predetermined portion in the P well region 68 corresponding to the P-well contact region 75. Thus reduced shunting resistance does not result in a voltage drop that causes the transistor 81 to be turned on, although the leakage current in the P well is considerably high. In other words, the shunting current, a critical current causing latch-up, is higher than the raised leakage current in the P well, thereby preventing latch-up. In the figure, $R_W$ is the shunting resistance between emitter and base of the PNP bipolar transistor and $R_S$ is the shunting resistance between emitter and base of the NPN bipolar transistor.

The emitter-base junctions of transistors 82 and 81 cannot be biased in the forward direction because the first and second heavily doped regions of buried layers 105 and 106 cause a decrease in the shunting resistances $R_W$ and $R_S$ between emitter and base of the transistors 82 and 81 and the current gains of the transistors 82 and 81. It is thus possible to prevent latch-up.

Another method to prevent latch-up is to make the product of current gains of parasitic bipolar transistors 81 and 82 less than 1. The current that causes latch-up from the base to the collector of the parasitic bipolar transistors is made up of minority carriers in the base. The possibility of latch-up is reduced by reducing this current. Such a reduction is achieved, for example, by increasing the base Gummel Number (defined as the integral of the doping level with the base over the path length of minoroty carriers traversing the base) of the bipolar transistors. That means, an increase in the base Gummel Number reduces the base minority carriers density and reduces the minority carrier because it increases the likelihood of recombination between minority and majority carriers. The concentrations of the first and second heavily doped regions of buried layers 105 and 106 are more than about ten times higher than those of N and P wells. The base Gummel number of the bipolar transistors is increased such that the product of current gains of parasitic bipolar transistors becomes less than 1, which prevents latch-up.

FIGS. 3A–3G are diagrams illustrating a process for fabricating the present invention semiconductor device.

Figure 3A:
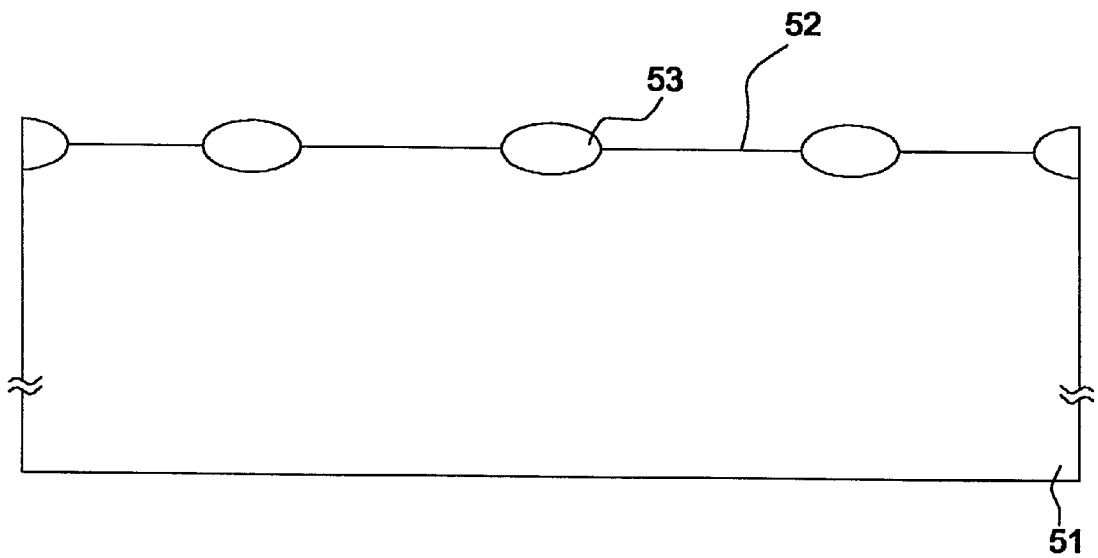
FIGS. 3A–3G are diagrams illustrating a process for fabricating a semiconductor device according to the present invention.

Referring to FIG. 3A, a field oxide layer 53 that defines active region of the device is formed on a P type semiconductor substrate 51 by the local oxidation of silicon (hereinafter called LOCOS). The field oxide layer 53 may be formed by the conventional LOCOS, or modified LOCOS, or STI (Shallow Trench Isolation) which includes etching of the silicon semiconductor substrate and then filling an insulating layer. The thickness of the field oxide layer 53 is about 3,000 to 6,000 Å.

Figure 3B:
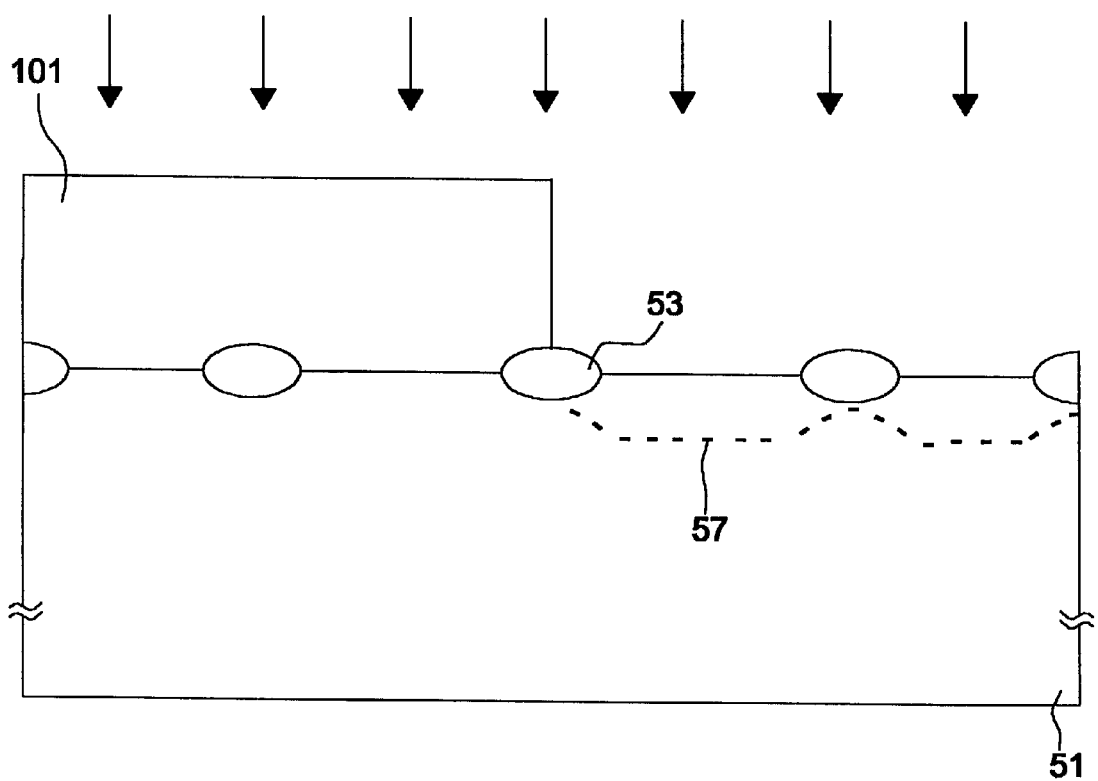

Referring to FIG. 3B, a photoresist 101 on the semiconductor substrate 51 including the field oxide layer 53 is patterned. N type impurities such as P ions are then implanted in the exposed portion. These N type impurities are injected into the semiconductor substrate 51 at an acceleration voltage high enough to force them to pass through the field oxide layer 53 at the exposed portion, forming a first N type region 57. The ion implantation of N type impurities, that is, P ions is performed with a dose of dopants ranging from 2.0 E12 to 2.0 E13 at an accelerating voltage of 300 to 700 KeV. In order to prevent damages such as point defects in the semiconductor substrate 51 due to ion implantation, a buffer oxide layer or the like is formed prior to the ion implantation.

Figure 3C:
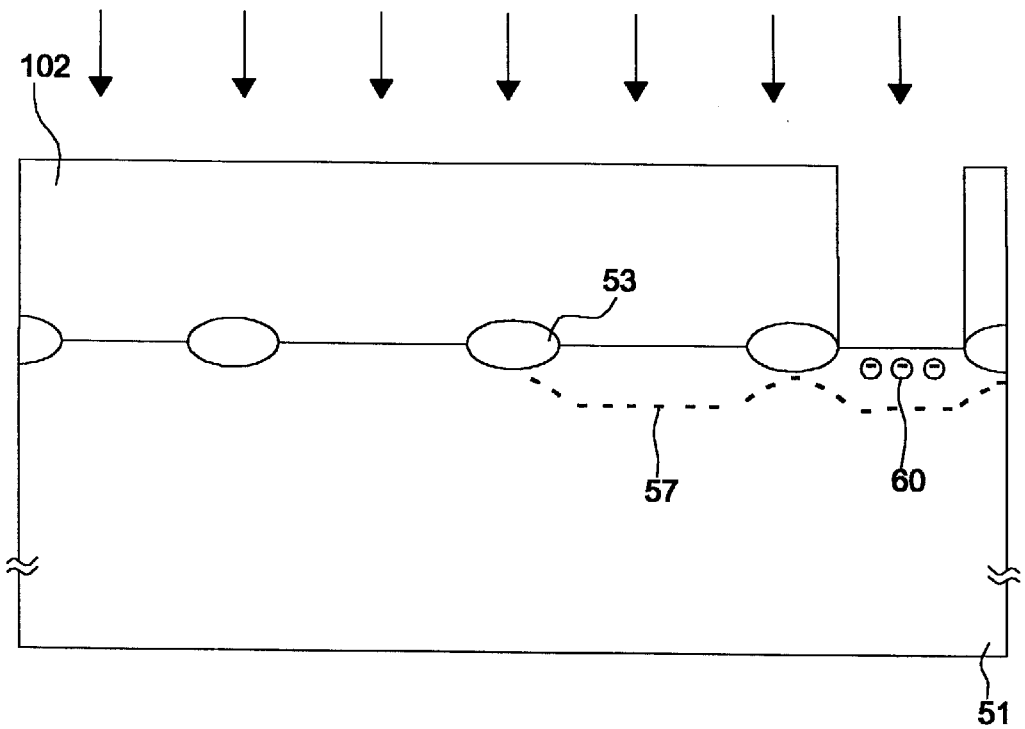

Referring to FIG. 3C, a photoresist 102 on the semiconductor substrate 51 including the first N type region 57 injected into the semiconductor substrate 51 is patterned. N type impurities such as P ions are then implanted in the exposed portion to form a second N type region 60. The impurities are injected into the second N type region 60 with a dose of dopants ranging from 3.0 E13 to 1.0 E14 at an acceleration voltage of 200 to 300 KeV. Compared with the impurities injected into the first N type region 57, the ion implantation in the second N type region 60 is performed with more dose of dopants but the acceleration voltage is lowered. Thus the second N type region 60 is located over the first N type region 57.

Figure 3D:
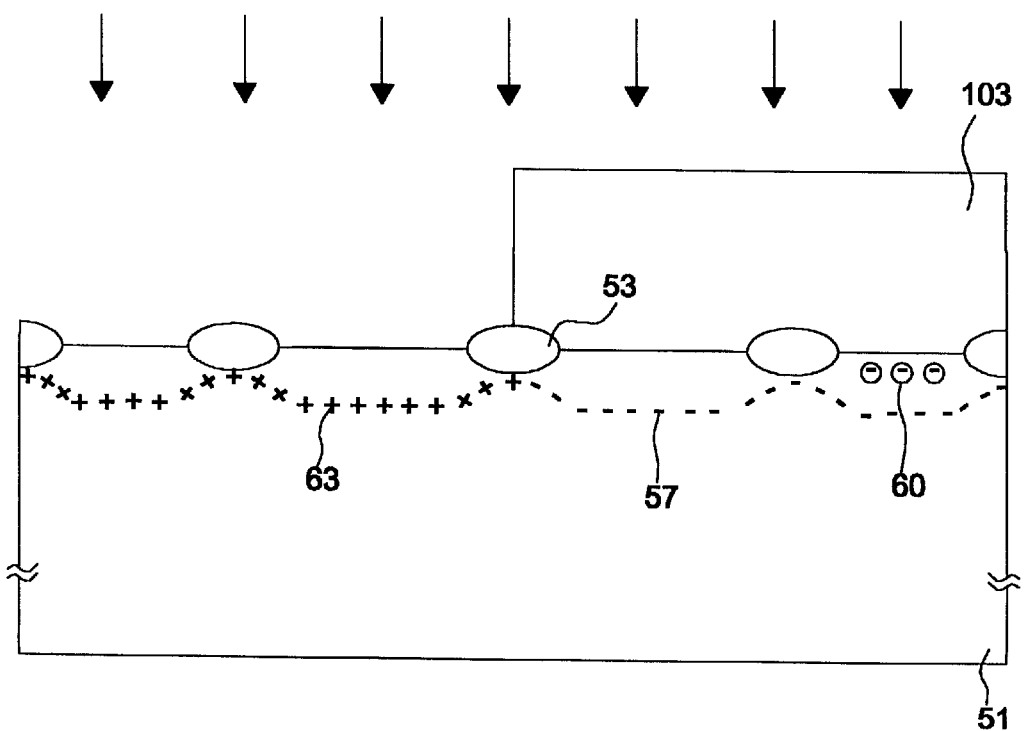

Referring to FIG. 3D, a photoresist 103 on the semiconductor substrate 51 and P type impurities such as $BF_2$ ions are implanted in the exposed portion. These P type impurities are injected into the semiconductor substrate 51 at an acceleration voltage high enough to force them to pass through the field oxide layer 53 at the exposed portion, forming a first P type region 63. The ion implantation of P type impurities, that is, $BF_2$ ions are performed with a dose of dopants ranging from 2.0 E12 to 2.0 E13 at an acceleration voltage of 150 to 350 KeV.

Figure 3E:
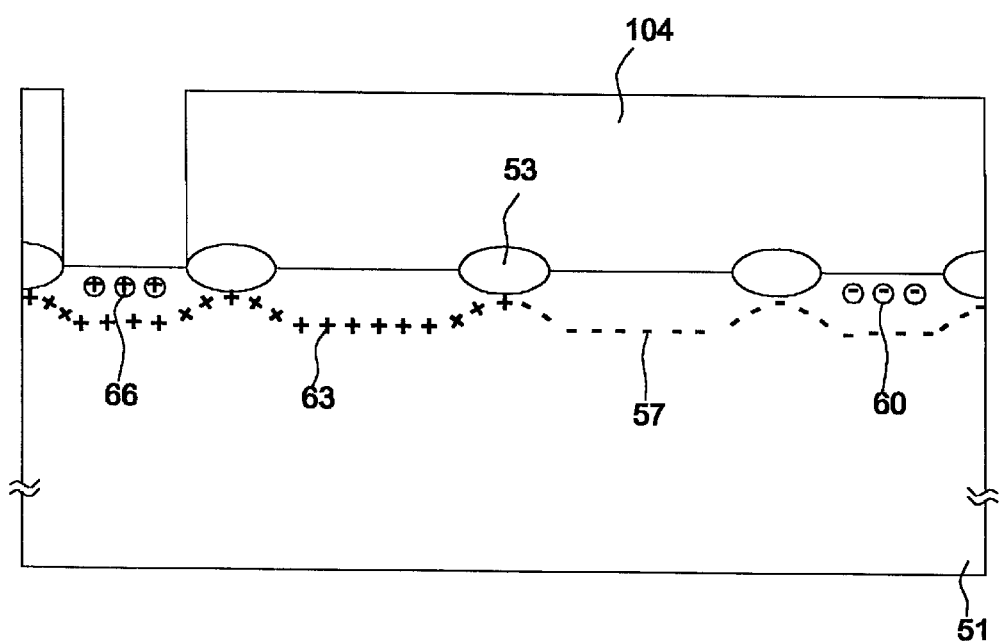

Referring to FIG. 3E, a photoresist 104 on the semiconductor substrate 51 including the first P type region 63 injected into the semiconductor substrate 51 is patterned. P type impurities such as $BF_2$ ions are implanted in the exposed portion to form a second P type region 66. The ion implantation is performed with a dose of dopants ranging from 3.0 E13 to 1.0 E14 at an acceleration voltage of 120 to 250 KeV. Compared with the impurities injected into the first P type region 63, the ion implantation is performed with more dose of dopants but the acceleration voltage is lowered. Thus the second P type region 66 is located over the first P type region 63.

Figure 3F:
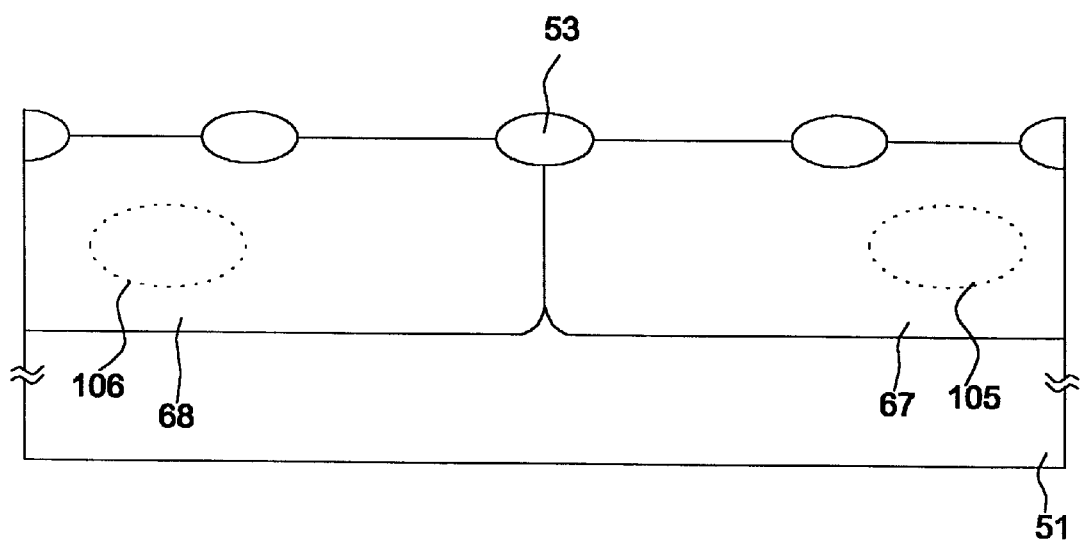

Referring to FIG. 3F, the semiconductor substrate 51 including the first and second N type regions 57 and 60 and the first and second P type regions 63 and 66 is subjected to a well drive-in process at a temperature more than about 1000° C. such that the first N and P regions 57 and 63 are diffused to form a twin well which includes N and P well regions 67 and 68 having a junction depth of about 1.5 to 2.0 $\mu$m with a retrograde profile. The second N and P well regions 60 and 66 are also diffused during the well drive-in process, so that first and second heavily doped regions of buried layers 105 and 106 having a dopant concentration about 10 or more times higher than those of N and P wells are formed at a predetermined portion in the N and P well regions 67 and 68, respectively. The dopant concentration of the first and second heavily doped regions of buried layers 105 and 106 is 1.0 E18 to 3.0 E18 atoms/cm$^3$). The concentration of the first heavily doped region of buried layer 105 is between those of lightly doped N well region 67 and heavily doped N-well contact-in region 76 and, in order to achieve the optimum shunting resistance, it can be obtained by varying the dose of impurity ions injected into the second N type region 60. The concentration of the second heavily doped region of buried layer 106 is between those of lightly doped P well region 68 and heavily doped P-well contact-in region 75 and it is obtained by varying the dose of impurity ions injected into the second P type region 66 in order to obtain the optimum shunting resistance. The first and second heavily doped regions of buried layers 105 and 106 can be formed by performing an ion implantation of N and P type impurities at a predetermined portion in the twin well and a subsequent heat cycle after the well drive-in process or before formation of the source and drain regions of MOS transistors.

Figure 3G:
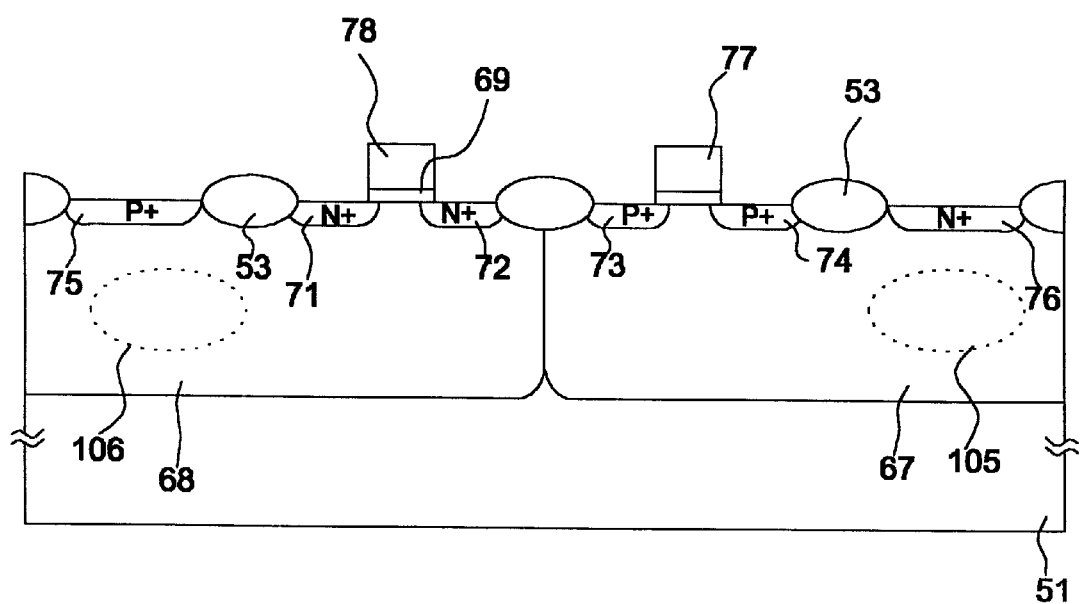

Referring to FIG. 3G, a gate insulating layer 69 is formed on the N and P well regions 67 and 68 by a thermal oxidation or CVD (Chemical Vapor Deposition) method. Polysilicon is deposited on the gate insulating layer 69 and patterned by a photo-etching method to form first and second gates 77 and 78. The first and second gates 77 and 78 are formed at a defined portion not corresponding to the first and second heavily doped regions of buried layers 105 and 106 on the N and P well regions 67 and 68. P and N type high concentration impurities are implanted on the both sides of the first and second gates 77 and 78 of N and P well regions 67 and 68 to form source and drain regions 74 and 73 of P channel FET and source and drain regions 71 and 72 of N channel FET. At this time, P and N type high concentration impurities are also implanted at a portion corresponding to the second and first heavily doped regions of buried layers 106 and 105 in the P and N well regions 68 and 67, forming P-well well and N-well contact regions 75 and 76. That means, the P-well contact region 75 is formed at a portion corresponding to the second heavily doped region of buried layer 106 in the P well region in a simultaneous manner while the source and drain regions 74 and 73 of P channel FET are formed on both sides of the first gate 77 in the N well region 67. Similarly, the N-well contact region 76 in the N well region 67 is formed as the source and drain regions 71 and 72 of N channel FET are formed in the P well region 68.

Such as in the present invention described above, the heavily doped N type region of buried layer is formed at a predetermined portion in the N well to reduce the shunting resistance between emitter and base of PNP bipolar transistor and increase the shunting current that may cause latch-up, as a result of which the latch-up can be prevented. Furthermore, the heavily doped P type region of buried layer is formed at a predetermined portion in the P well. This also reduces the shunting resistance between emitter and base of NPN bipolar transistor and increases the shunting current causing latch-up. Consequently, the latch-up is avoidable. The heavily doped region of buried layer formed at a predetermined portion in the well also contributes to prevention of latch-up by increasing the base Gummel Number of parasitic bipolar transistor and lowering the product of the current gain of the parasitic bipolar transistor to be below 1.

It will be apparent to those skilled in the art that various modifications and variations can be made in the semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device comprising:

forming a field oxide layer on a semiconductor substrate having a first conductivity type where the semiconductor substrate includes first and second MOS transistor regions and first and second contact regions;

forming a first well having a second conductivity type in the semiconductor substrate, wherein the first well includes the first MOS transistor region and the first contact region;

forming a heavily doped region of buried layer having the second conductivity type at a portion spaced corresponding to the first contact region in the first well;

forming a second well having the first conductivity type in the semiconductor substrate, wherein the second well includes the second MOS transistor region and the second contact region; and forming a heavily doped region of buried layer having the first conductivity type at a portion spaced corresponding to the second contact region in the second well, wherein the heavily doped region of the second conductivity type does not extend under a first MOS transistor in the first well, and wherein the heavily doped region of the first conductivity type does not extend under a second MOS transistor in the second well.

2. The method as claimed in claim 1, wherein the heavily doped region of buried layer having the first and second conductivity types are spaced at a distance of about 0.25 to 1.0 μm beneath the major surface of the semiconductor substrate.

3. The method as claimed in claim 1, wherein the junction depth of the first and second wells is 1.5 to 2.0 μm.

4. The method as claimed in claim 1, wherein the concentration of the heavily doped region of buried layer having the first conductivity type is higher than that of the second well and lower than that of the second contact region.

5. The method as claimed in claim 1, wherein the concentration of the heavily doped region of buried layer having the second conductivity type is higher than that of the first well and lower than that of the first contact region.

6. The method as claimed in claim 1, wherein the forming a heavily doped region of buried layer having the second conductivity type comprises:

depositing a first photoresist over the semiconductor substrate and the field oxide layer that exposes only the semiconductor substrate corresponding to the first contact region;

implanting impurities using the first photoresist as a mask;

removing the first photoresist; and annealing to form the heavily doped region having the second conductivity type.

7. The method as claimed in claim 6, wherein a source and drain of the first MOS transistor region is formed after the heavily doped region having the second conductivity type.

8. The method as claimed in claim 1, wherein a first parasitic bipolar transistor is a PNP bipolar transistor with a source region of the first MOS transistor region forming an emitter, the first well forming a base and the second well forming a collector, wherein a resistance between the emitter and the base is reduced by the heavily doped region having the second conductivity type.

9. A method of fabricating a semiconductor device comprising:

forming a field oxide layer on a semiconductor substrate having a first conductivity type where the semiconductor substrate includes first and second MOS transistor regions and first and second contact regions;

forming a first well having a second conductivity type in the semiconductor substrate that includes the first MOS transistor region and the first contact region;

forming a first heavily doped region having the second conductivity type in the semiconductor substrate corresponding to the first contact region in the first well, wherein the first heavily doped region does not extend below the first MOS transistor in the first well;

forming a second well having the first conductivity type in the semiconductor substrate that includes the second MOS transistor region and the second contact region; and forming a second heavily doped region having the first conductivity type in the semiconductor substrate corresponding to the second contact region in the second well.

10. The method of claim 9, wherein the second heavily doped region does not extend below the second MOS transistor in the second well.

11. The method of claim 10, wherein the first and second heavily doped regions are spaced at a distance of about 0.25 to 1.0 μm beneath a major surface of the semiconductor substrate, and wherein the junction depth of the first and second wells is 1.5 to 2.0 μm.

12. The method of claim 10, wherein the concentration of the first heavily doped region having the second conductivity type is higher than that of the first well and lower than that of the first contact region, and wherein the concentration of the second heavily doped region having the first conductivity type is higher than that of the second well and lower than that of the second contact region.

13. The method of claim 9, wherein the first conductivity type is N type and the second conductivity type is P type.

14. A method of fabricating a semiconductor device, comprising:

forming a field oxide layer on a semiconductor substrate that includes first and second MOS transistor regions and first and second contact regions;

forming a first well having a second conductivity type in the semiconductor substrate, wherein the first well includes the first MOS transistor region and the first contact region;

forming a first heavily doped region having the second conductivity type in the first well corresponding to the first contact region;

forming a second well having the first conductivity type in the semiconductor substrate, wherein the second well includes the second MOS transistor region and the second contact region;

forming a second heavily doped region having the first conductivity type in the second well corresponding to the second contact region, wherein the second heavily doped region does not extend below a second MOS transistor in the second well;

connecting a first prescribed voltage to the first contact region and a first electrode of the first MOS transistor; and connecting a second prescribed voltage to the second contact region and a first electrode of the second MOS transistor.

15. The method of claim 14, wherein the first and second prescribed voltages are a power source voltage and ground voltage, respectively.

16. The method of claim 15, further comprising connecting an input voltage to control electrodes of first and second MOS transistors and an output voltage to second electrodes of the first and second MOS transistors.

17. The method of claim 14, wherein the first heavily doped region does not extend below the first MOS transistor in the first well.

18. The method of claim 14, wherein the concentration of the first heavily doped region having the second conductivity type is higher than that of the first well and lower than that of the first contact region, and wherein the concentration of the second heavily doped region having the first conductivity type is higher than that of the second well and lower than that of the second contact region.

* * * * *